United States Patent
Shih

(10) Patent No.: US 11,876,063 B2
(45) Date of Patent: Jan. 16, 2024

(54) SEMICONDUCTOR PACKAGE STRUCTURE AND METHOD FOR PREPARING THE SAME

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 336 days.

(21) Appl. No.: 17/462,330

(22) Filed: Aug. 31, 2021

(65) Prior Publication Data
US 2023/0060355 A1    Mar. 2, 2023

(51) Int. Cl.
H01L 23/00 (2006.01)

(52) U.S. Cl.
CPC ............. *H01L 24/06* (2013.01); *H01L 24/05* (2013.01); *H01L 2224/02372* (2013.01); *H01L 2224/05093* (2013.01); *H01L 2224/32012* (2013.01); *H01L 2224/33104* (2013.01)

(58) Field of Classification Search
CPC ............... H01L 24/06; H01L 24/05; H01L 2224/32012; H01L 2224/33104; H01L 25/0657; H01L 2224/02372; H01L 2224/05093; H01L 21/76898; H01L 24/83; H01L 2224/13025; H01L 2225/06544; H01L 23/481
See application file for complete search history.

(56) References Cited

U.S. PATENT DOCUMENTS

| | | | |
|---|---|---|---|
| 11,004,833 B1* | 5/2021 | Kandala | H01L 23/481 |
| 11,114,433 B2* | 9/2021 | Chen | H01L 24/06 |
| 2012/0299194 A1* | 11/2012 | Lee | H01L 24/11 257/774 |
| 2014/0217587 A1 | 8/2014 | Chen et al. | |
| 2015/0021784 A1* | 1/2015 | Lin | H01L 27/0688 438/459 |
| 2018/0358328 A1 | 12/2018 | Kang et al. | |
| 2020/0395339 A1* | 12/2020 | Chen | H01L 24/06 |
| 2020/0402951 A1* | 12/2020 | Chen | H01L 24/03 |
| 2021/0066255 A1* | 3/2021 | Chen | H01L 21/565 |
| 2021/0074660 A1 | 3/2021 | Lee | |
| 2021/0134748 A1* | 5/2021 | Liu | H01L 23/481 |
| 2021/0225790 A1* | 7/2021 | Chen | H01L 24/32 |

(Continued)

FOREIGN PATENT DOCUMENTS

| | | | |
|---|---|---|---|
| TW | 200921889 A | 5/2009 | |
| TW | 201005903 A | 2/2010 | |
| TW | 202123413 A | 6/2021 | |

*Primary Examiner* — Mamadou L Diallo
(74) *Attorney, Agent, or Firm* — Muncy, Geissler, Olds & Lowe, P.C.

(57) ABSTRACT

A semiconductor package structure includes a first semiconductor wafer including a first bonding pad. The semiconductor package structure also includes a second semiconductor wafer including a second bonding pad and a third bonding pad. The second bonding pad and the third bonding pad are bonded to the first bonding pad of the first semiconductor wafer. The semiconductor package structure further includes a first via penetrating through the second semiconductor wafer to physically contact the first bonding pad of the first semiconductor wafer. A portion of the first via is disposed between the second bonding pad and the third bonding pad.

20 Claims, 21 Drawing Sheets

(56) References Cited

U.S. PATENT DOCUMENTS

| | | | |
|---|---|---|---|
| 2021/0305214 A1* | 9/2021 | Chen | H01L 24/95 |
| 2022/0013503 A1* | 1/2022 | Jung | H01L 23/3128 |
| 2022/0077117 A1* | 3/2022 | Yu | H01L 23/485 |
| 2022/0165721 A1* | 5/2022 | Lee | H01L 25/50 |
| 2022/0231067 A1* | 7/2022 | Huang | H01L 27/14687 |
| 2022/0262771 A1* | 8/2022 | Chen | H01L 23/481 |
| 2022/0359456 A1* | 11/2022 | Chen | H01L 21/76898 |
| 2022/0399295 A1* | 12/2022 | Lai | H01L 24/08 |
| 2023/0038603 A1* | 2/2023 | Choi | H01L 22/32 |

* cited by examiner

SEMICONDUCTOR PACKAGE STRUCTURE AND METHOD FOR PREPARING THE SAME

TECHNICAL FIELD

The present disclosure relates to a semiconductor package structure and a method for preparing the same, and more particularly, to a three-dimensional integrated circuit (3DIC) semiconductor package structure and a method for preparing the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, chip-on-chip technique is now widely used for manufacturing semiconductor package structures.

In one approach, using a stack of at least two semiconductor wafers (or semiconductor chips or dies) in a 3D package to form, for example, a memory device, it is possible to produce a product having a memory capacity which is twice as large as that obtainable through other semiconductor integration processes. In addition to the increase in memory capacity, a stacked package also provides improved mounting density and mounting area utilization efficiency. Due to such advantages, research and development of stacked package technology has accelerated.

However, the manufacturing and integration of semiconductor package structures becomes increasingly complicated. The semiconductor package structure is assembled with a number of integrated components including various materials having different thermal properties. Because many components with different materials are combined, the complexity of the manufacturing operations of the semiconductor package structure is increased. Accordingly, there is a continuous need to improve the manufacturing process of semiconductor package structures so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor package structure is provided. The semiconductor package structure includes a first semiconductor wafer including a first bonding pad. The semiconductor package structure also includes a second semiconductor wafer including a second bonding pad and a third bonding pad. The second bonding pad and the third bonding pad are bonded to the first bonding pad of the first semiconductor wafer. The semiconductor package structure further includes a first via penetrating through the second semiconductor wafer to physically contact the first bonding pad of the first semiconductor wafer. A portion of the first via is disposed between the second bonding pad and the third bonding pad.

In some embodiments, the first via is in direct contact with a sidewall of the second bonding pad and a sidewall of the third bonding pad facing the sidewall of the second bonding pad. In some embodiments, the first via is in direct contact with a top surface of the second bonding pad and a top surface of the third bonding pad. In some embodiments, the second bonding pad and the third bonding pad are different portions of a single continuous ring structure.

In some embodiments, the first semiconductor wafer further includes a fourth bonding pad and the second semiconductor wafer further includes a fifth bonding pad bonded to the fourth bonding pad, and a width of the fourth bonding pad is less than a width of the first bonding pad. In some embodiments, the semiconductor package structure further includes a second via disposed in the second semiconductor wafer, wherein a width of the second via is less than a width of the first via. In some embodiments, a top surface of the second via is coplanar with a top surface of the first via, and a bottom surface of the second via is higher than a bottom surface of the first via.

In another embodiment of the present disclosure, a semiconductor package structure is provided. The semiconductor package structure includes a first semiconductor wafer including a first bonding pad. The semiconductor package structure also includes a second semiconductor wafer including a second bonding pad and a third bonding pad exposed at a first side of the second semiconductor wafer. The second bonding pad and the third bonding pad are bonded to the first bonding pad of the first semiconductor wafer. The semiconductor package structure further includes a first via extending from the first side of the second semiconductor wafer to a second side of the second semiconductor wafer. The first via is in direct contact with the first bonding pad, the second bonding pad and the third bonding pad. In addition, the semiconductor package structure includes a first conductive line disposed in the second semiconductor wafer and away from the first side of the second semiconductor wafer, and a second via disposed in the second semiconductor wafer and extending from the second side of the second semiconductor wafer to the first conductive line. A width of the first via is greater than a width of the second via.

In some embodiments, the first semiconductor wafer further includes a fourth bonding pad and the second semiconductor wafer further includes a fifth bonding pad bonded to the fourth bonding pad, and a width of the first bonding pad is greater than a width of the fourth bonding pad. In some embodiments, the first via is in direct contact with a top surface of the first bonding pad, a top surface and a sidewall of the second bonding pad, and a top surface and a sidewall of the third bonding pad facing the sidewall of the second bonding pad. In some embodiments, the first via further includes an upper liner disposed over a top surface of the second bonding pad and a top surface of the third bonding pad, and a lower liner covering a sidewall of the second bonding pad and a sidewall of the third bonding pad facing the sidewall of the second bonding pad, wherein the lower liner is separated from the upper liner. In some embodiments, the first via further includes a barrier layer surrounding a conductive layer, wherein the barrier layer is surrounded by the upper liner and the lower liner, and wherein the barrier layer is in direct contact with a top surface of the first bonding pad, the top surface of the second bonding pad, and the top surface of the third bonding pad.

In some embodiments, the semiconductor package structure further includes a redistribution structure disposed on the second side of the second semiconductor wafer, and a third semiconductor wafer including a sixth bonding pad and a seventh bonding pad exposed at a first side of the third semiconductor wafer, wherein the sixth bonding pad and the seventh bonding pad are bonded to a second conductive line in the redistribution structure. In addition, the semiconductor package structure includes a third via extending from the first side of the third semiconductor wafer to a second side of the third semiconductor wafer, wherein the third via is in direct contact with the sixth bonding pad, the seventh bonding pad and the second conductive line. In some embodiments, the semiconductor package structure further includes a third conductive line disposed in the third semiconductor wafer and away from the first side of the third semiconductor wafer, and a fourth via disposed in the third semiconductor wafer and extending from the second side of the third semiconductor wafer to the third conductive line, wherein a width of the third via is greater than a width of the fourth via.

In yet another embodiment of the present disclosure, a method for preparing a semiconductor package structure is provided. The method includes forming a first semiconductor wafer including a first bonding pad, and forming a second semiconductor wafer including a second bonding pad and a third bonding pad. The method also includes bonding the second semiconductor wafer onto the first semiconductor wafer using a hybrid bonding process such that the second bonding pad and the third bonding pad are bonded to the first bonding pad, and forming a first opening and a second opening in the second semiconductor wafer by performing a first etching process. The first bonding pad is exposed by the first opening, and a first conductive line in the second semiconductor wafer away from an interface between the first semiconductor wafer and the second semiconductor wafer is exposed by the second opening. The method further includes forming a first via in the first opening and a second via in the second opening.

In some embodiments, a width of the first opening is greater than a width of the second opening. In some embodiments, the method further includes thinning the second semiconductor wafer after the second semiconductor wafer is bonded onto the first semiconductor wafer and before the first etching process is performed. In some embodiments, the first opening has a lower portion and an upper portion, the lower portion of the first opening is between the second bonding pad and the third bonding pad, and the upper portion of the first opening exposes a top surface of the second bonding pad and a top surface of the third bonding pad.

In some embodiments, the method further includes forming a redistribution structure on a side of the second semiconductor wafer opposite from the first semiconductor wafer, wherein the redistribution structure has a second conductive line and a third conductive line exposed at opposite sides of the redistribution structure, and the second conductive line is in direct contact with the first via. In addition, the method includes forming a third semiconductor wafer including a fourth bonding pad and a fifth bonding pad, and bonding the third semiconductor wafer onto the redistribution structure such that the fourth bonding pad and the fifth bonding pad are bonded to the third conductive line. In some embodiments, the method further includes forming a third opening and a fourth opening in the third semiconductor wafer by performing a second etching process, wherein the third conductive line, the fourth bonding pad and the fifth bonding pad are exposed by the third opening, and a fourth conductive line in the third semiconductor wafer away from an interface between the third semiconductor wafer and the redistribution structure is exposed by the fourth opening, and wherein a width of the third opening is greater than a width of the fourth opening. In addition, the method includes forming a third via in the third opening and a fourth via in the fourth opening.

Embodiments of a semiconductor package structure and method for preparing the same are provided in the disclosure. In some embodiments, the semiconductor package structure includes a first semiconductor wafer and a second semiconductor wafer bonded to the first semiconductor wafer. The first semiconductor wafer has a first bonding pad, and the second semiconductor wafer has a second bonding pad and a third bonding pad. In some embodiments, the second and the third bonding pads are bonded to the first bonding pad, and a via is formed penetrating through the second semiconductor wafer and extending between the second and the third bonding pad to physically contact the first bonding pad. By forming at least two bonding pads in the second semiconductor wafer to bond with the same bonding pad in the first semiconductor wafer, bonding pad dishing effect during the planarization process performed on the bonding pads may be reduced. Moreover, since the contact areas between the bonding pads and the via are increased, the performance of the semiconductor package structure can be enhanced by providing a reduced contact resistance.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
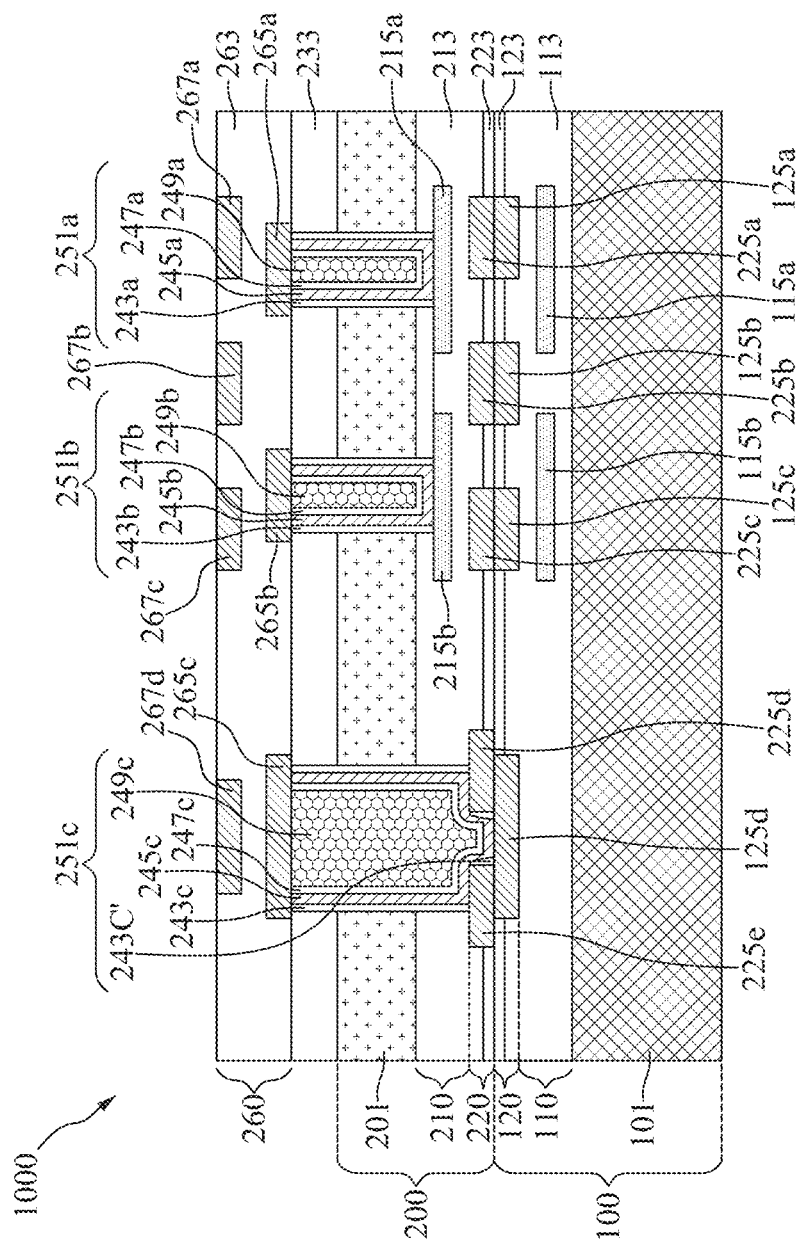
FIG. 1 is a cross-sectional view illustrating a semiconductor package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor package structure 1000, in accordance with some embodiments. In some embodiments, the semiconductor package structure 1000 includes a first semiconductor wafer 100 and a second semiconductor wafer 200 bonded onto the first semiconductor wafer 100. In some embodiments, the semiconductor package structure 100 includes a dielectric layer 233 disposed over the second semiconductor wafer 200, and a redistribution structure 260 disposed over the dielectric layer 233.

In some embodiments, the first semiconductor wafer 100 includes a substrate 101, a redistribution structure 110 disposed over the substrate 101, and a bonding structure 120 disposed over the redistribution structure 110. In some embodiments, the redistribution structure 110 includes a dielectric layer 113 and conductive lines 115a and 115b disposed in the dielectric layer 113. In some embodiments, the bonding structure 120 includes a bonding dielectric layer 123 and bonding pads 125a, 125b, 125c, and 125d. In some embodiments, the upper portions of the bonding pads 125a-125d are embedded in the bonding dielectric layer 123, and the lower portions of the bonding pads 125a-125d are embedded in the dielectric layer 113. In some embodiments, the bonding pads 125a-125d are exposed at a side of the first semiconductor wafer 100.

In some embodiments, the second semiconductor wafer 200 includes a bonding structure 220, a redistribution structure 210 disposed over the bonding structure 220, and a substrate 201 disposed over the redistribution structure 210. In some embodiments, the bonding structure 220 includes a bonding dielectric layer 223 and bonding pads 225a, 225b, 225c, 225d, and 225e. In some embodiments, the bonding pads 225a-125e are exposed at a side of the second semiconductor wafer 200 facing the side of the first semiconductor wafer 100 where the bonding pads 125a-d are exposed.

Moreover, in some embodiments, the bonding pad 225a is bonded to the bonding pad 125a, the bonding pad 225b is bonded to the bonding pad 125b, the bonding pad 225c is bonded to the bonding pad 125c, and the bonding pads 225d and 225e are bonded to the bonding pad 125d. In some embodiments, the redistribution structure 210 includes a dielectric layer 213 and conductive lines 215a and 215b disposed in the dielectric layer 213. In some embodiments, the upper portions of the bonding pads 225a-225e are embedded in the dielectric layer 213, and the lower portions of the bonding pads 225a-225e are embedded in the bonding dielectric layer 223.

In some embodiments, the redistribution structure 260 includes a dielectric layer 263 and conductive lines 265a, 265b, 265c, 267a, 267b, 267c, and 267d embedded in the dielectric layer 263. In some embodiments, the conductive lines 265a-265c are exposed at a side of the redistribution structure 260 facing the dielectric layer 233, and the conductive lines 267a-267d are exposed at a side of the redistribution structure 260 away from the dielectric layer 233. In some embodiments, the semiconductor package structure 1000 includes vias 251a, 251b, and 251c. In some embodiments, the via 251a is disposed between and electrically connected to the conductive lines 215a and 265a, the via 251b is disposed between and electrically connected to the conductive lines 215b and 265b, and the via 251c is disposed between and electrically connected to the bonding pad 125d and the conductive line 265c.

In addition, in some embodiments, the via 251c is in direct contact with the bonding pads 125d, 225d, and 225e. In some embodiments, the via 251c has a size greater than each of the vias 251a and 251b. In some embodiments, the via 251a includes a conductive layer 249a, a seed layer 247a covering the sidewalls and the bottom surface of the conductive layer 249a, a barrier layer 245a covering the sidewalls and the bottom surface of the seed layer 247a, and a liner 243a covering the sidewalls of the barrier layer 245a.

In some embodiments, the via 251b includes a conductive layer 249b, a seed layer 247b covering the sidewalls and the bottom surface of the conductive layer 249b, a barrier layer 245b covering the sidewalls and the bottom surface of the seed layer 247b, and a liner 243b covering the sidewalls of the barrier layer 245b. In some embodiments, the via 251c has an upper portion disposed over the bonding pads 225d and 225e, and a lower portion disposed between the bonding pads 225d and 225e. In some embodiments, the upper portion of the via 251c is in direct contact with the top surfaces of the bonding pads 225d and 225e, and the lower portion of the via 251c is in direct contact with the top surface of the bonding pad 125d, and the sidewalls of the bonding pads 225d and 225e facing each other. In some embodiments, a width of the upper portion of the via 251c is greater than a width of the lower portion of the via 251c.

In some embodiments, the vias 251c includes a conductive layer 249c, a seed layer 247c covering the sidewalls and the bottom surface of the conductive layer 249c, a barrier layer 245c covering the sidewalls and the bottom surface of the seed layer 247c, an upper liner 243c covering the upper sidewalls of the barrier layer 245c, and a lower liner 243c' covering the lower sidewalls of the barrier layer 245c. In some embodiments, the barrier layer 245c is separated from the dielectric layer 233, the substrate 201 and the dielectric layer 213 by the upper liner 243c, and the barrier layer 245c is separated from the bonding pads 225d and 225e by the lower liner 243c'. In some embodiments, the barrier layer 245c is in direct contact with the top surface of the bonding pad 125d, the top surface of the bonding pad 225d, and the top surface of the bonding pad 225e.

The bonding pad 125d is also referred to as a first bonding pad, and the bonding pads 225d and 225e are also referred to as a second bonding pad and a third bonding pad. Since the second and the third bonding pads are bonded together to the first bonding pad, the bonding pad dishing effect during the planarization process performed on the bonding pads may be reduced. Moreover, by bonding the second and the third bonding pads to the first bonding pad, the contact areas between the second bonding pad, the third bonding pad, and the via 251c are increased. Therefore, the performance of the semiconductor package structure 1000 can be enhanced by providing a reduced contact resistance.

Figure 2:
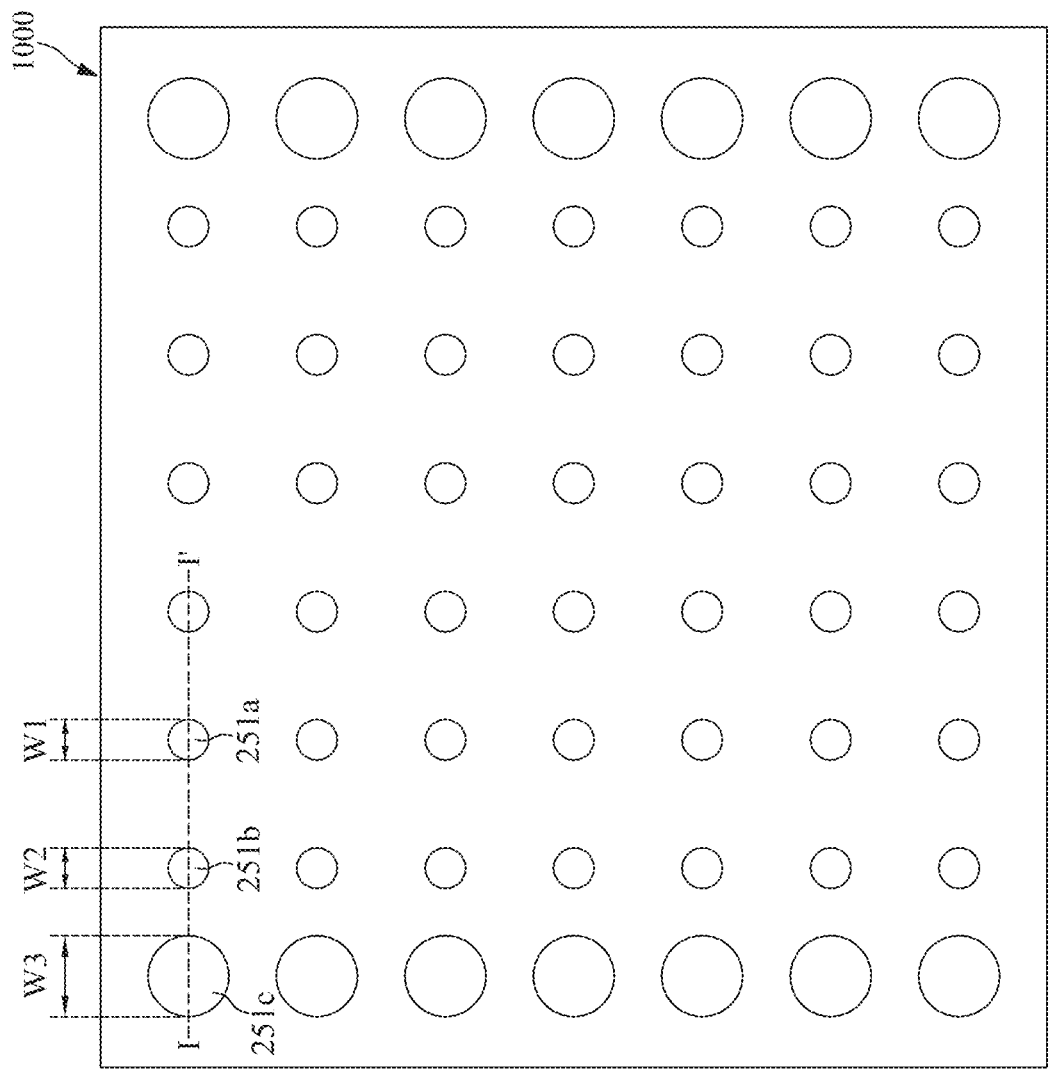
FIG. 2 is a partial top view illustrating the vias in the semiconductor package structure, in accordance with some embodiments.

FIG. 2 is a partial top view illustrating the vias 251a, 251b and 251c in the semiconductor package structure 1000, in accordance with some embodiments. In some embodiments, the via 251a has a width W1, the via 251b has a width W2, the via 251c has a width W3, and the width W3 is greater than each of the widths W1 and W2. In some embodiments, the vias 251a and 251b are used for signal transmission, and the vias for signal transmission are arranged in the center region of the semiconductor package structure 1000. In some embodiments, the via 251c is used for power transmission, and the vias used for power transmission are arranged in the peripheral region of the semiconductor package structure 100, as shown in the top view layout of FIG. 2.

Figure 3:
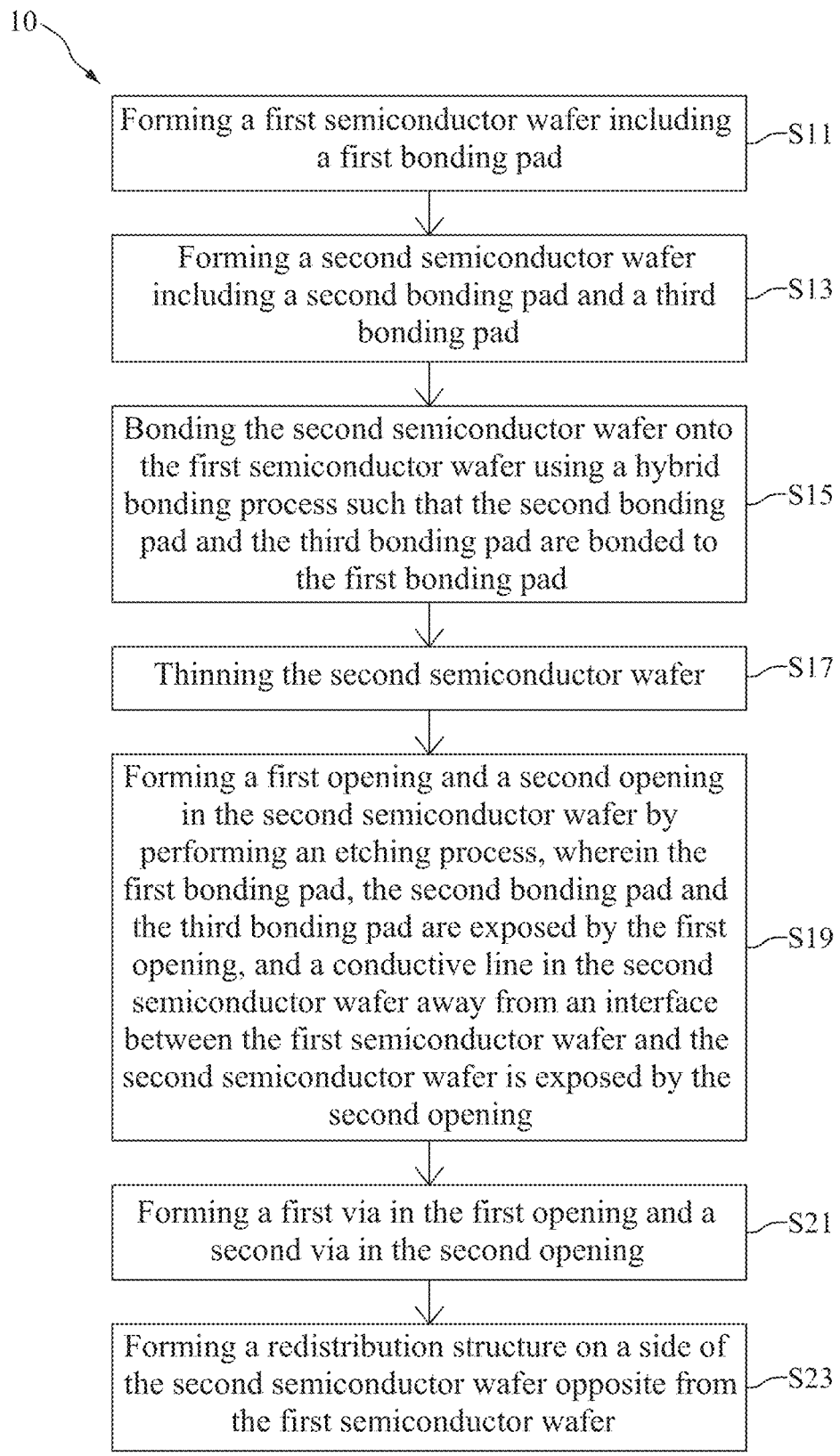
FIG. 3 is a flow diagram illustrating a method for forming a semiconductor package structure, in accordance with some embodiments.

FIG. 3 is a flow diagram illustrating a method 10 for forming a semiconductor package structure, such as the semiconductor package structure 1000 shown in FIG. 1, and the method 10 includes steps S11, S13, S15, S17, S19, S21 and S23, in accordance with some embodiments. The steps S11 to S23 of FIG. 3 are elaborated in connection with the following figures.

Figure 4:
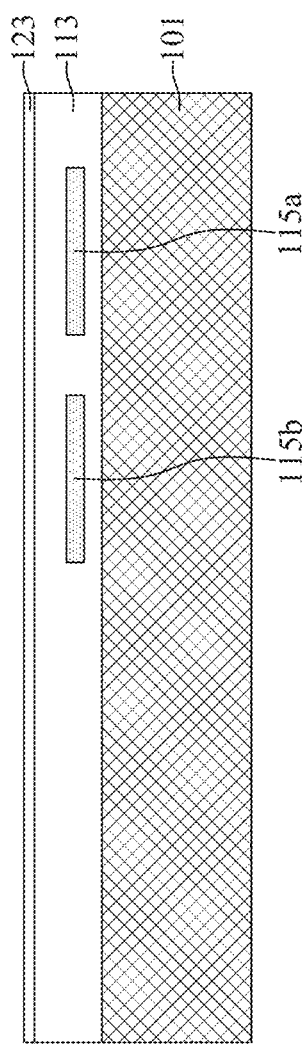
FIGS. 4 and 5 are cross-sectional views illustrating intermediate stages of forming a first semiconductor wafer during the formation of the semiconductor package structure, in accordance with some embodiments.
Figure 5:
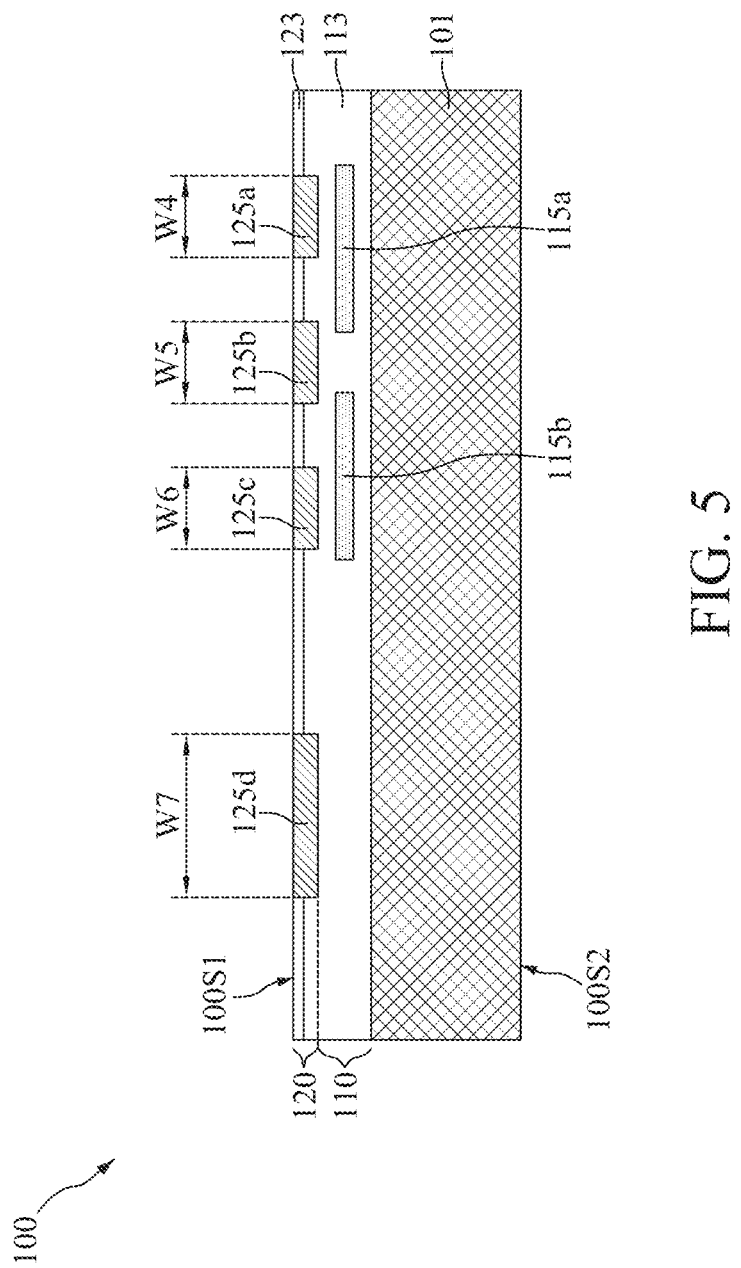

FIGS. 4 and 5 are cross-sectional views illustrating intermediate stages of forming the first semiconductor wafer 100 during the formation of the semiconductor package structure 1000, in accordance with some embodiments.

As shown in FIG. 4, the substrate 101 is provided. The substrate 101 may be a portion of an integrated circuit (IC) chip that includes various passive and active microelectronic devices, such as resistors, capacitors, inductors, diodes, p-type field effect transistors (pFETs), n-type field effect transistors (nFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, fin field-effect transistors (FinFETs), other suitable IC components, or combinations thereof.

Depending on the IC fabrication stage, the substrate 101 may include various material layers (e.g., dielectric layers, semiconductor layers, and/or conductive layers) configured to form IC features (e.g., doped regions, isolation features, gate features, source/drain features, interconnect features, other features, or combinations thereof). The substrate 101 has been simplified for the sake of clarity. It should be noted that additional features can be added in the substrate 101, and some of the features described below can be replaced, modified, or eliminated in other embodiments.

Then, the dielectric layer 113 is formed over the substrate 101, the conductive lines 115a and 115b are formed in the dielectric layer 113, and the bonding dielectric layer 123 is formed over the dielectric layer 113, as shown in FIG. 4 in accordance with some embodiments. The materials of the dielectric layer 113 and the bonding dielectric layer 123 may include silicon oxide, silicon nitride, silicon oxynitride, or another applicable dielectric material. The dielectric layer 113 and the bonding dielectric layer 123 may be formed by deposition processes, such as a chemical vapor deposition (CVD) process, a physical vapor deposition (PVD) process, an atomic layer deposition (ALD) process, a spin-on process, or another applicable process. In some embodiments, the dielectric layer 113 and the bonding dielectric layer 123 are formed by the same material, and there may be no obvious interface between the dielectric layer 113 and the bonding dielectric layer 123.

Moreover, the materials of the conductive lines 115a and 115b may include tungsten (W), aluminum (Al), copper (Cu), titanium (Ti), tantalum (Ta), a combination thereof, or another applicable material. In some embodiments, the conductive lines 115a and 115b are formed by an etching process, a deposition process, and a planarization process. The etching process is performed to form recesses (not shown) in the dielectric layer 113. In some embodiments, the etching process is a dry etching process. The deposition process may include a CVD process, a PVD process, an ALD process, a spin-on process, or another applicable process. In some embodiments, the planarization process includes a chemical mechanical planarization (CMP) process. In some embodiments, the dielectric layer 113 includes multiple dielectric layers, and the conductive lines 115 and 115b are formed between the forming of these dielectric layers.

Next, the bonding pads 125a-125d are formed in the bonding dielectric layer 123 and the dielectric layer 113, and the first semiconductor wafer 100 is obtained, as shown in FIG. 5 in accordance with some embodiments. In some embodiments, the first semiconductor wafer 100 has a first side 100S1 and a second side 100S2 opposite to the first side 100S1, and the bonding pads 125a-125d are exposed at the first side 100S1. The respective step is illustrated as the step S11 in the method 10 shown in FIG. 3.

In some embodiments, the materials of the bonding pads 125a-125d include copper (Cu). In some embodiments, the bonding pads 125a-125d are formed by an etching process, a deposition process, and a planarization process. Some processes used to form the bonding pads 125a-125d are similar to, or the same as those used to form the conductive lines 115a and 115b, and details thereof are not repeated herein. Moreover, the bonding pad 125a has a width W4, the bonding pad 125b has a width W5, the bonding pad 125c has a width W6, and the bonding pad 125d has a width W7. In some embodiments, the width W7 is greater than each of the widths W4, W5, and W6.

In addition, in some embodiments, the widths W4, W5 and W6 are substantially the same. Within the context of this disclosure, the word "substantially" means preferably at least 90%, more preferably 95%, even more preferably 98%, and most preferably 99%.

Figure 6:
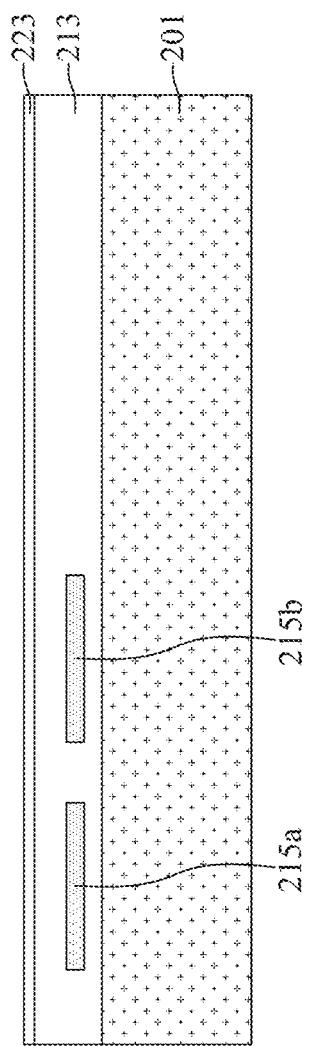
FIGS. 6 and 7 are cross-sectional views illustrating intermediate stages of forming a second semiconductor wafer during the formation of the semiconductor package structure, in accordance with some embodiments.
Figure 7:
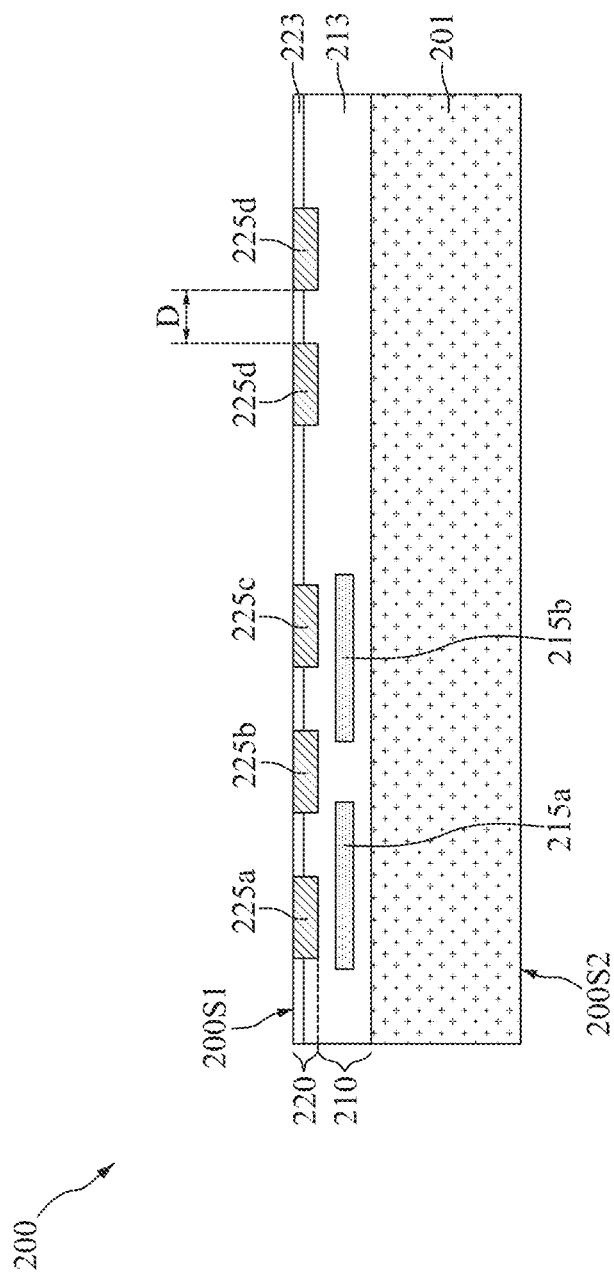

FIGS. 6 and 7 are cross-sectional views illustrating intermediate stages of forming the second semiconductor wafer 200 during the formation of the semiconductor package structure 1000, in accordance with some embodiments. As shown in FIG. 6, the substrate 201 is provided. Some details of the substrate 201 are similar to, or the same as that of the substrate 101 of the first semiconductor wafer 100 and are not repeated herein.

Then, the dielectric layer 213 is formed over the substrate 201, the conductive lines 215a and 215b are formed in the dielectric layer 213, and the bonding dielectric layer 223 is formed over the dielectric layer 213, as shown in FIG. 6 in accordance with some embodiments. After the bonding dielectric layer 223 is formed, the bonding pads 225a-225e are formed in the in the bonding dielectric layer 223 and the dielectric layer 213, and the second semiconductor wafer 200 is obtained, as shown in FIG. 7 in accordance with some embodiments.

In some embodiments, the second semiconductor wafer 200 has a first side 200S1 and a second side 200S2 opposite to the first side 200S1, and the bonding pads 225a-225e are exposed at the first side 200S1. The respective step is illustrated as the step S13 in the method 10 shown in FIG. 3. In some embodiments, the bonding pads 225d and 225e have a distance D therebetween, and the distance D is smaller than the width W7 of the bonding pad 125d of the first semiconductor wafer 100. Some materials and processes of the processes shown in FIGS. 6 to 7 may be similar to, or the same as, those shown in FIGS. 4 to 5 and are not repeated herein.

Figure 8:
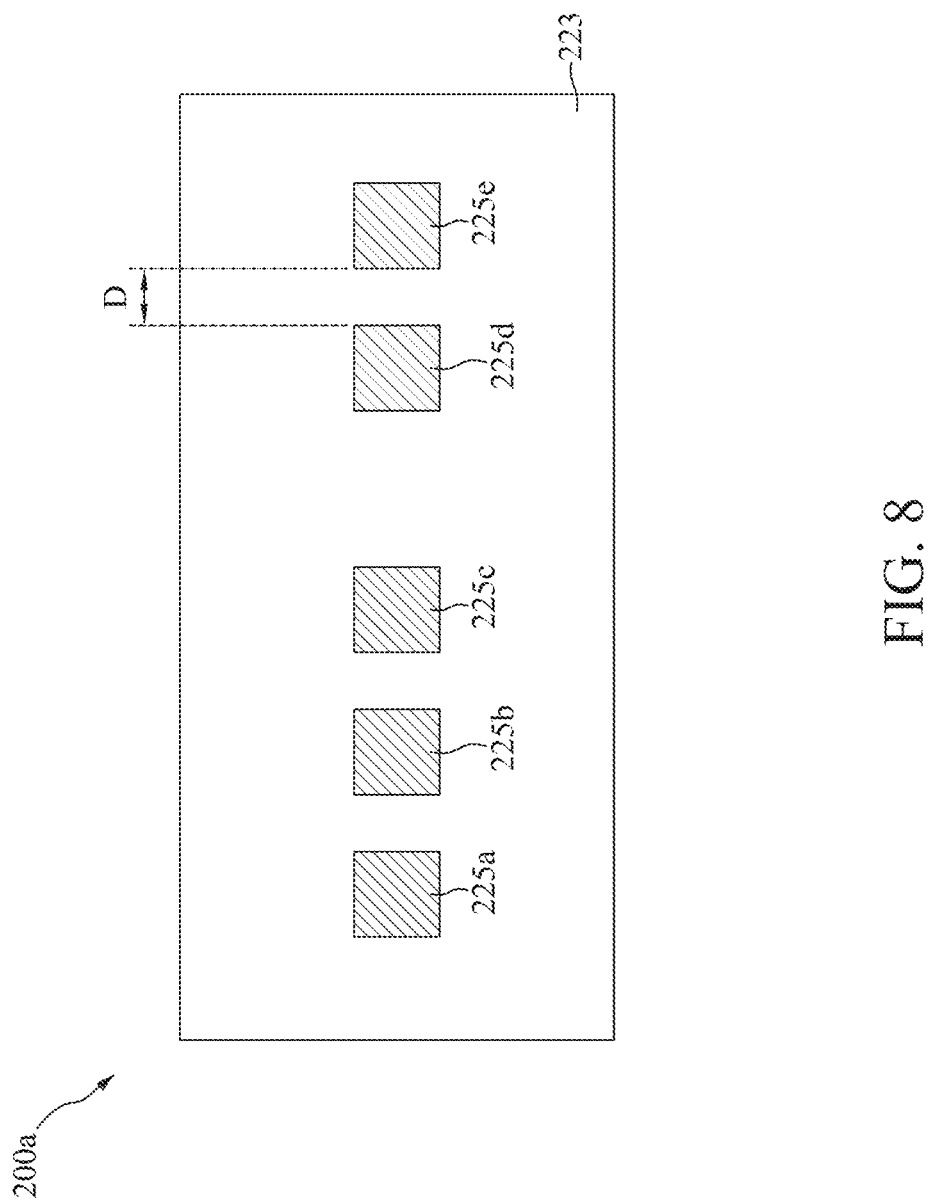
FIGS. 8 and 9 are partial top views illustrating the bonding pads in the second semiconductor wafer, in accordance with some embodiments.
Figure 9:
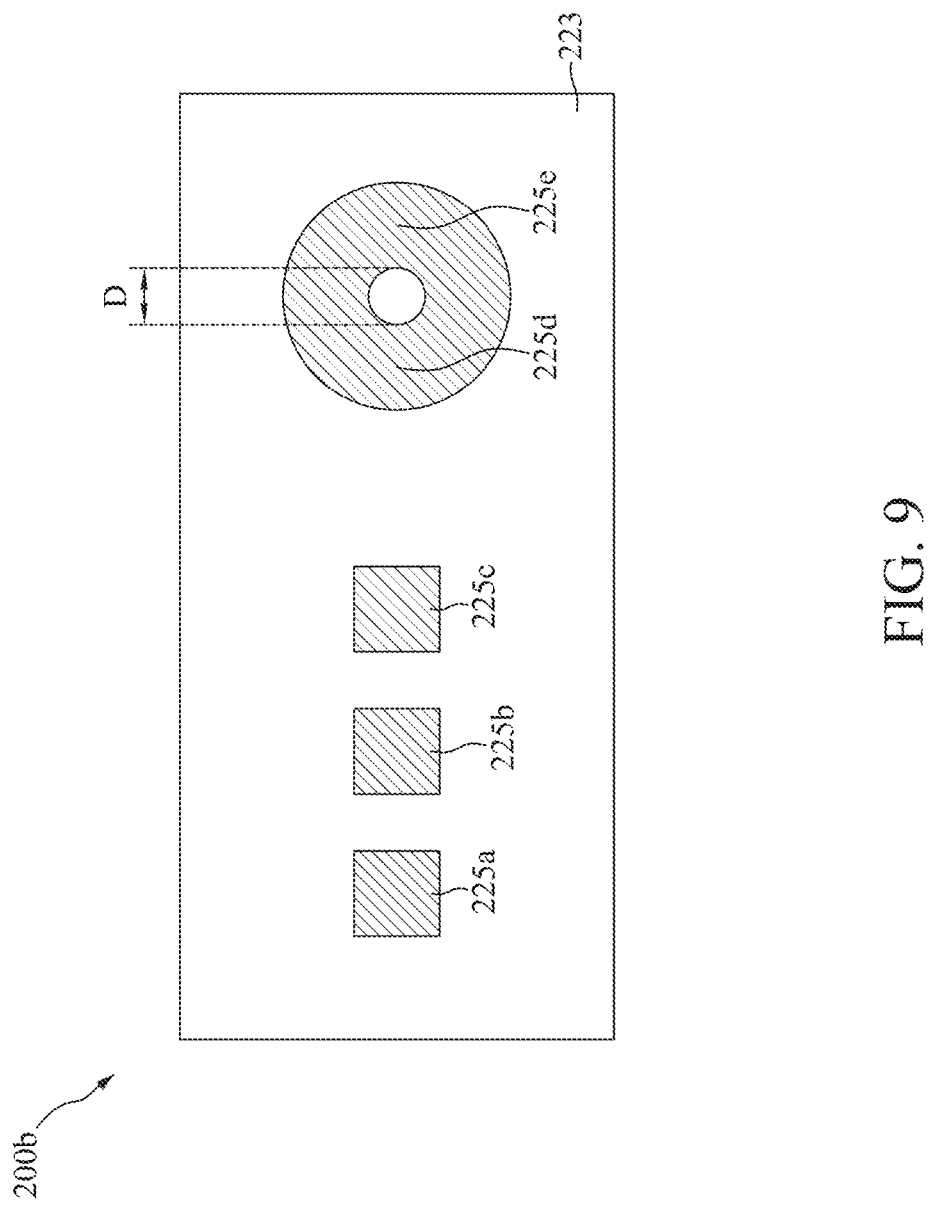

FIGS. 8 and 9 are partial top views illustrating the bonding pads 225a-225e in the second semiconductor wafer 200, in accordance with some embodiments. Referring to FIG. 8, in the second semiconductor wafer 200a, the bonding pads 225a-225e are separated from each other, in accordance with some embodiments. Referring to FIG. 9, in the modified second semiconductor wafer 200b, the bonding pads 225a-225c are separated from each other, and the bonding pads 225d and 225e are physically connected, in accordance with some embodiments. In some embodiments, the bonding pads 225d and 225e are different portions of a single continuous ring structure.

Figure 10:
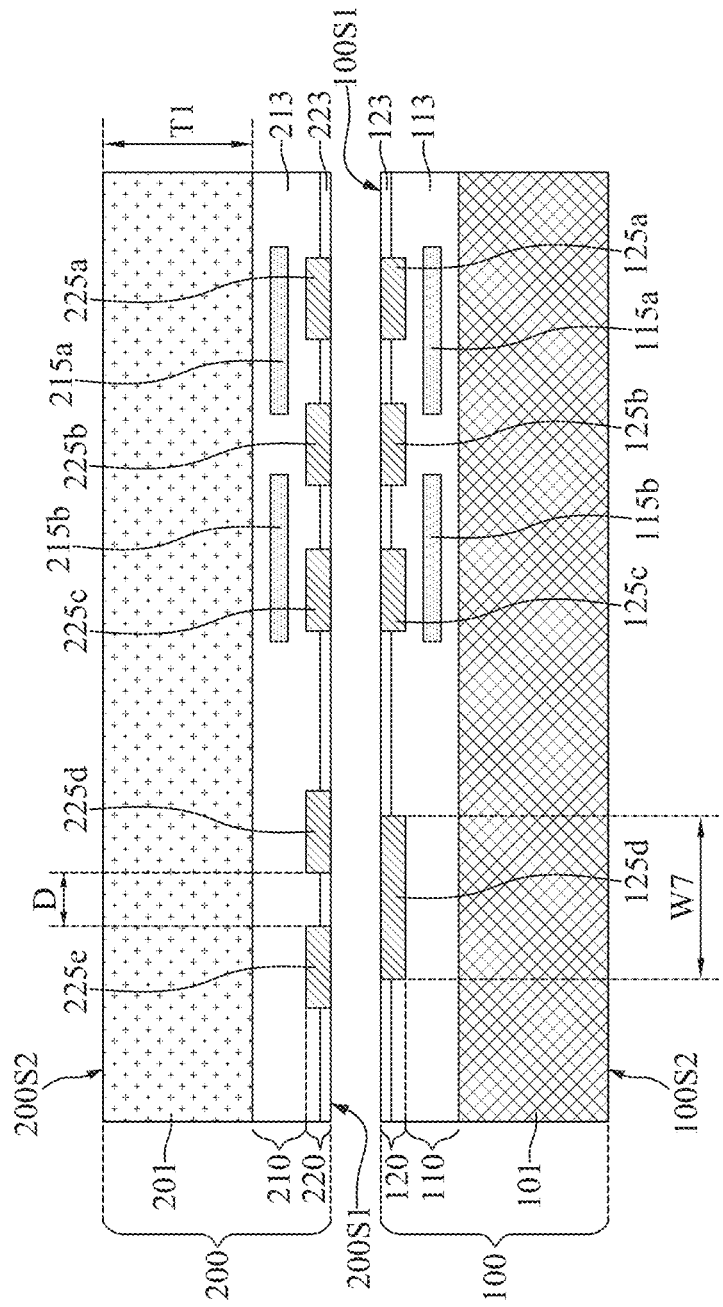
FIGS. 10-18 are cross-sectional views illustrating intermediate stages of forming the semiconductor package structure, in accordance with some embodiments.
Figure 11:
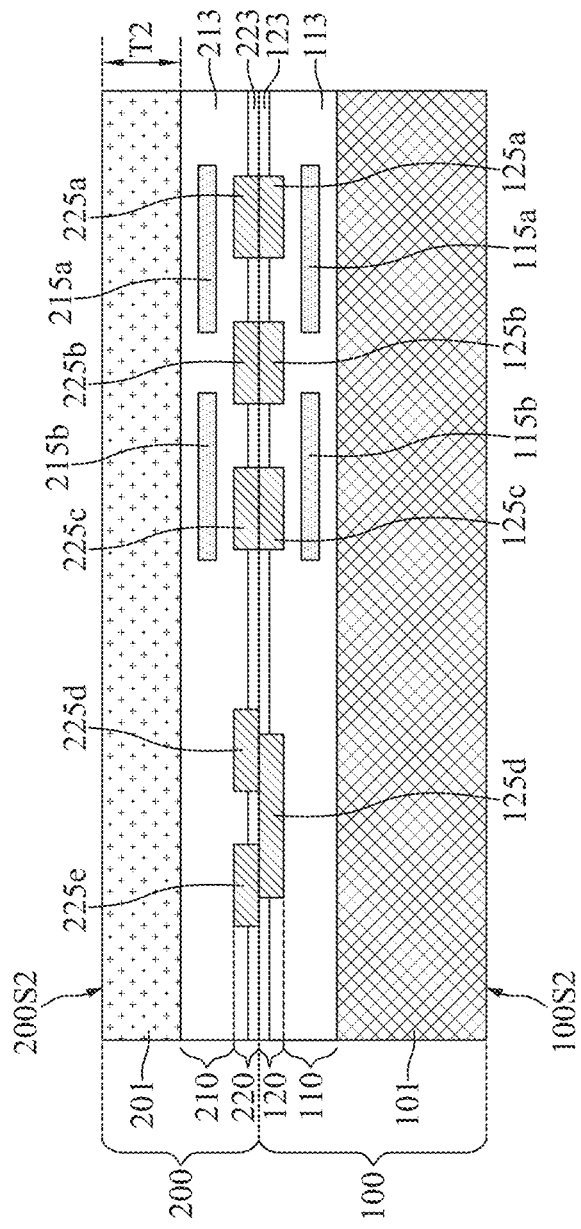

FIGS. 10-18 are cross-sectional views illustrating intermediate stages of forming the semiconductor package structure 1000, in accordance with some embodiments. After the first semiconductor wafer 100 and the second semiconductor wafer 200 are formed, the second semiconductor wafer 200 is flipped upside down and bonded onto the first semiconductor wafer 100 with the first side 200S1 of the second semiconductor wafer 200 facing the first side 100S1 of the first semiconductor wafer 100, as shown in FIGS. 10 and 11 in accordance with some embodiments. The respective step is illustrated as the step S15 in the method 10 shown in FIG. 3.

Next, the substrate 201 of the second semiconductor wafer 200 is thinned by using a planarization process, such that the thickness T1 of the original substrate 201 is reduced to the thickness T2, as shown in FIGS. 10 and 11 in accordance with some embodiments. The respective step is illustrated as the step S17 in the method 10 shown in FIG. 3. The planarization process may include a grinding process, a CMP process, a dry polishing process, an etching process, a cutting process, one or more other applicable processes, or a combination thereof.

Figure 12:
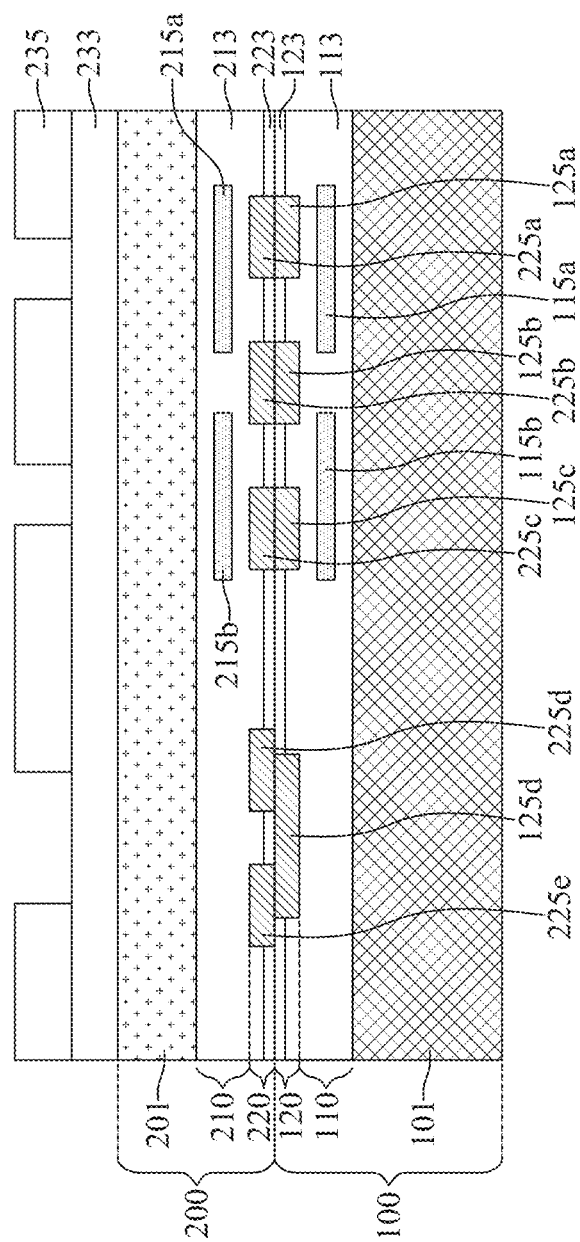

Subsequently, a dielectric layer 233 is formed over the thinned second semiconductor wafer 200, and a patterned mask 235 is formed over the dielectric layer 233, as shown in FIG. 12 in accordance with some embodiments. In some embodiments, the patterned mask 235 has openings exposing the underlying dielectric layer 233. Some materials and processes used to form the dielectric layer 233 are similar to, or the same as those used to form the dielectric layer 113, and details thereof are not repeated herein.

Figure 13:
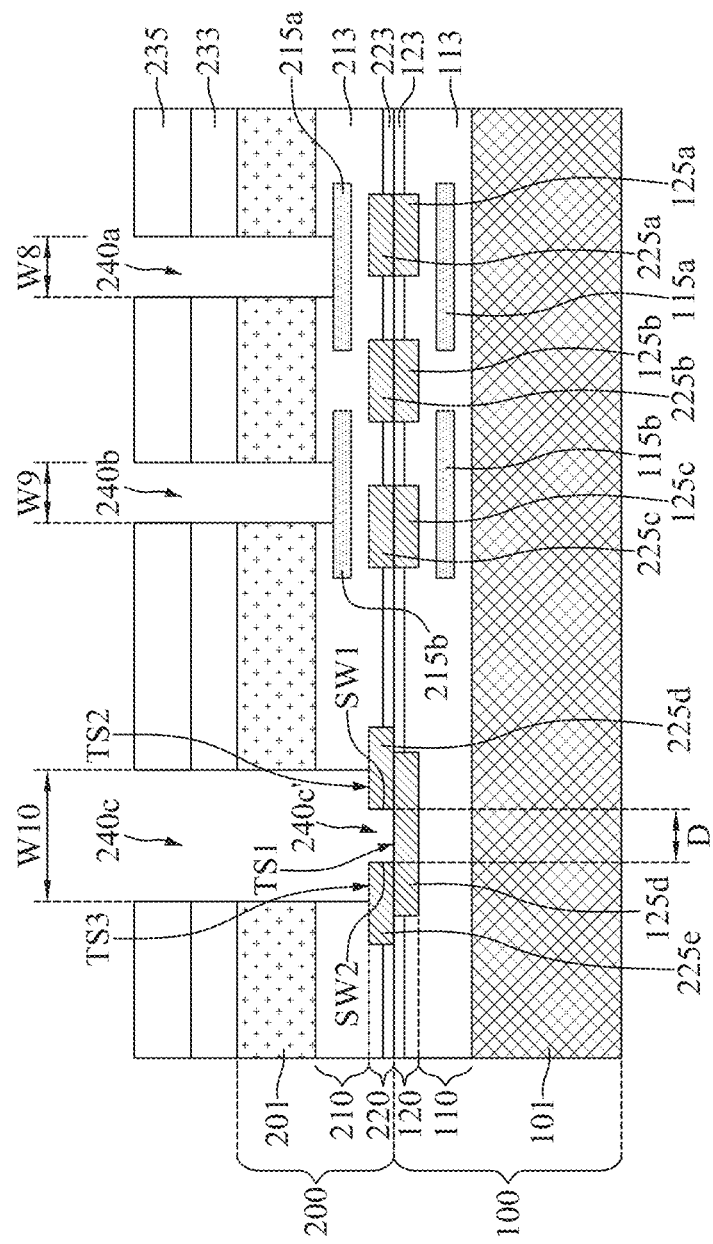

Then, an etching process is performed using the patterned mask 235 as a mask, such that openings 240a, 240b, and 240c are formed in the second semiconductor wafer 200, as shown in FIG. 13 in accordance with some embodiments. In some embodiments, the conductive lines 215a and 215b act as etch stop layers for the openings 240a and 240b, respectively, and the bonding pads 125d, 225d and 225e act as etch stop layers for the opening 240c. In some embodiments, the bottom surfaces of the openings 240a and 240b are higher than the bottom surface of the opening 240c.

In some embodiments, the opening 240c has a lower portion 240c' between the bonding pads 225d and 225e. In some embodiments, the top surface TS1 of the bonding pad 125d, the sidewall SW1 of the bonding pad 225d, and the sidewalls SW2 of the bonding pad 225e are exposed by the lower portion 240c' of the opening 240c. In some embodiments, the top surface TS2 of the bonding pad 225d and the top surface TS3 of the bonding pad 225e are exposed by the upper portion of the opening 240c.

In some embodiments, the width W10 of the upper portion of the opening 240c is greater than the width of the lower portion 240c' of the opening 240c (i.e., the distance D). In some embodiments, the width W10 of the upper portion of the opening 240c is greater than the width W8 of the opening 240a and the width W9 of the opening 240b. In some embodiments, the opening 240c penetrates through the second semiconductor wafer 200 and the dielectric layer 233. In some embodiments, the etching process includes a dry etching process, a wet etching process, and a combination thereof. The respective step is illustrated as the step S19 in the method 10 shown in FIG. 3.

Figure 14:
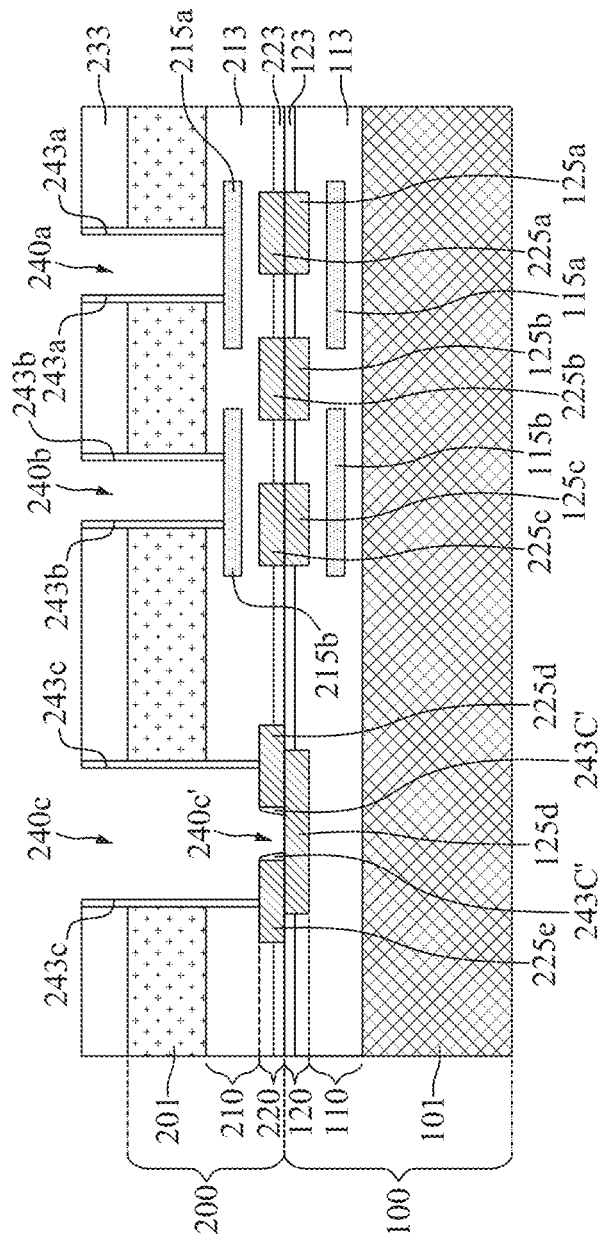

Next, the liners 243a is formed lining the sidewalls of the opening 240a, the liners 243b is formed lining the sidewalls of the opening 240b, and the upper liners 243c and the lower liners 243c' are formed lining the upper sidewalls and the lower sidewalls (i.e, the sidewalls SW1 of the bonding pad 225s and the sidewalls SW2 of the bonding pad 225e) of the opening 240c, respectively, as shown in FIG. 14 in accordance with some embodiments. In some embodiments, the liners 243a, 243b, 243c, and 243c' are made of a dielectric material, such as silicon nitride, silicon oxynitride, tetraethylorthosilicate (TEOS) oxide, a combination thereof, or another applicable material.

In some embodiments, the liners 243a, 243b, 243c, and 243c' are formed by conformally depositing a lining material (not shown) over the structure of FIG. 13, and performing an etching process (e.g., an anisotropic etching process) to remove the same amount of the lining material vertically in all places, leaving the liners 243a, 243b, 243c, and 243c' over the sidewalls of the openings 240a, 240b, and 240c. The deposition process may include a CVD process, a PVD process, an ALD process, a thermal process, or another applicable process. In some embodiments, the etching process is a dry etching process.

After the liners 243a, 243b, 243c, and 243c' are formed, the top surface TS1 of the bonding pad 125d, the top surface TS2 of the bonding pad 225d, and the top surface TS3 of the bonding pad 225e are exposed by the opening 240c. In some embodiments, the patterned mask 235 is removed by a wet stripping process, a plasma ashing process, or another applicable process.

Figure 15:
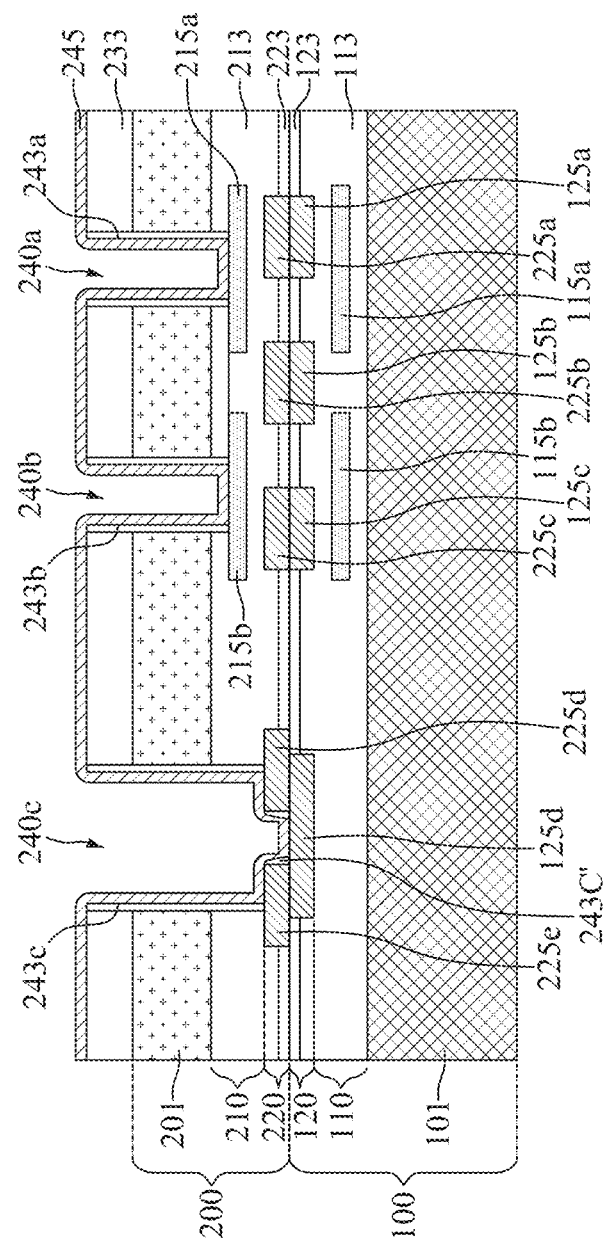

Subsequently, a barrier material 245 is conformally deposited over the structure of FIG. 14, as shown in FIG. 15 in accordance with some embodiments. In some embodiments, the barrier material 245 is formed lining the openings 240a, 240b, and 240c (including the lower portion 240c') and covering the liners 243a, 243b, 243c, and 243c'. In some embodiments, the top surface of the dielectric layer 233 is covered by the barrier material 245.

In some embodiments, the barrier material 245 includes titanium (Ti), titanium nitride (TiN), tantalum (Ta), tantalum nitride (TaN), tungsten (W), tungsten nitride (WN), tungsten carbide (WC), tungsten carbon nitride (WCN), another applicable material, or a combination thereof. The barrier material 245 may be formed by a deposition process, such as a CVD process, a PVD process, an ALD process, or another applicable process.

Figure 16:
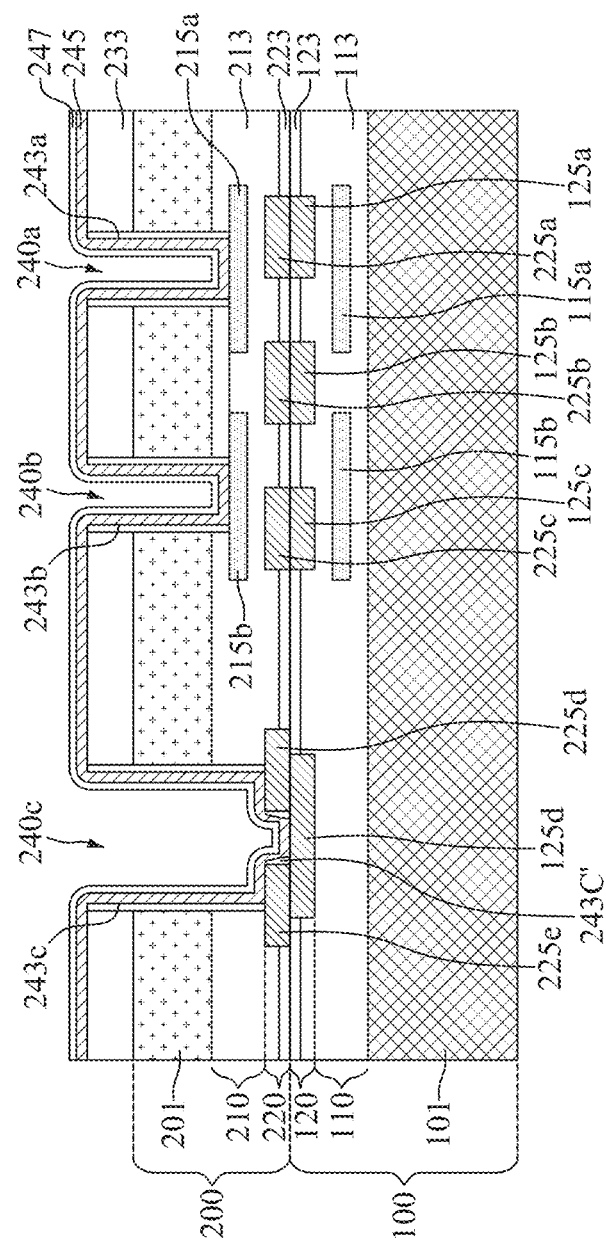

Then, a seed material 247 is conformally deposited over the structure of FIG. 15 and covering the barrier material 245, as shown in FIG. 16 in accordance with some embodiments. In some embodiments, the seed material 247 is formed lining the openings 240a, 240b, and 240c (including the lower portion 240c'). In some embodiments, the seed material 247 extends over the top surface of the dielectric layer 233. In some embodiments, the seed material 247 includes copper (Cu) or another applicable material. The seed material 247 may be formed by a deposition process, such as a CVD process, a PVD process, an ALD process, or another applicable process.

Figure 17:
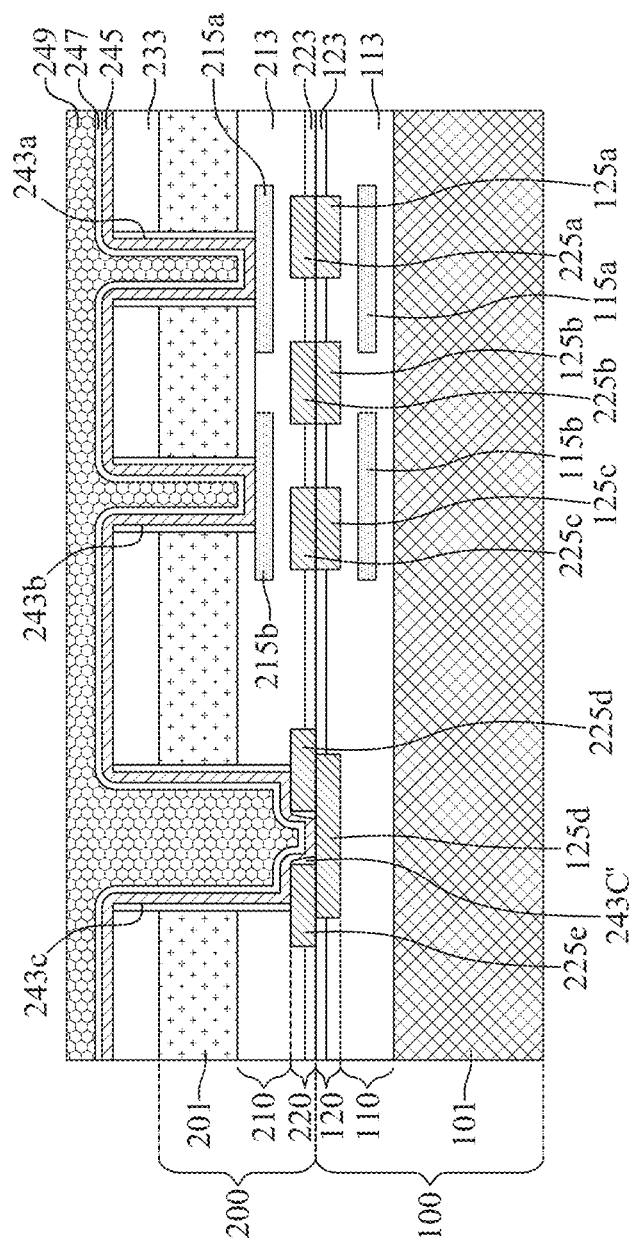

Next, a conductive material 249 is formed over the seed material 247, as shown in FIG. 17 in accordance with some embodiments. In some embodiments, the remaining portions of the openings 240a, 240b, and 240c are filled by the conductive material 249, and the conductive material 249 extends over the top surface of the dielectric layer 233. In some embodiments, the conductive material 249 includes copper (Cu), aluminum (Al), tungsten (W), a combination thereof, or another applicable metal material. The conductive material 249 may be formed by a deposition process, such as a CVD process, a PVD process, an ALD process, or another applicable process.

Figure 18:
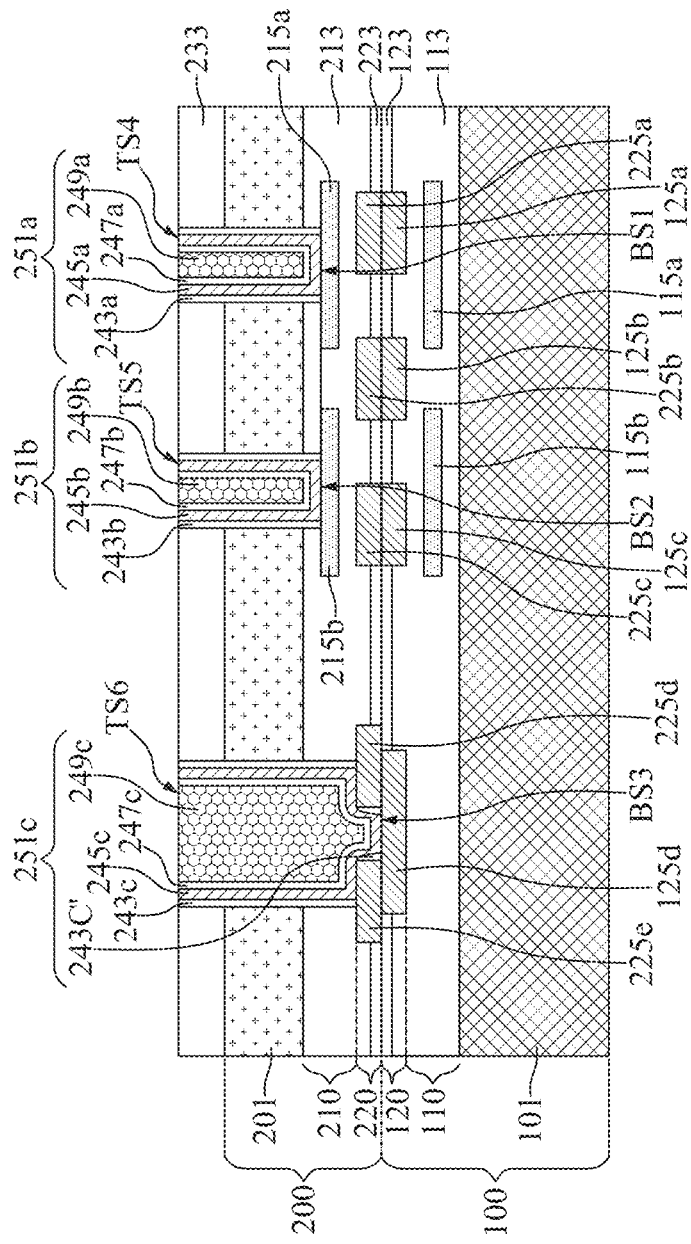

Subsequently, a planarization process is performed on the barrier material 245, the seed material 247, and the conductive material 249 to form the barrier layers 245a, 245b and 245c, the seed layers 247a, 247b and 247c, and the conductive layers 249a, 249b and 249c, as shown in FIG. 18 in accordance with some embodiments. The planarization process may include a CMP process, which removes the excess portions of the barrier material 245, the seed material 247, and the conductive material 249 over the top surface of the dielectric layer 233.

After the planarization process is performed, the vias 251a, 251b and 251c are obtained. The respective step is illustrated as the step S21 in the method 10 shown in FIG. 3. In some embodiments, the top surface TS4 of the via 251a, the top surface TS5 of the via 251b, and the top surface TS6 of the via 251c are substantially coplanar with each other. In some embodiments, the bottom surface BS1 of the via 251a and the bottom surface BS2 of the via 251b are higher than the bottom surface BS3 of the via 251c. In some embodiments, the height of the via 251c is greater than the height of the via 251a and the height of the via 251b.

Then, the redistribution structure 263 is formed (or bonded) over the vias 251a, 251b and 251c, as shown in FIG. 1 in accordance with some embodiments. The respective step is illustrated as the step S23 in the method 10 shown in FIG. 3. Some materials and processes used to form the dielectric layer 263 and the conductive lines 265a-265c and 267a-267d are similar to, or the same as those used to form the dielectric layer 113 and the conductive lines 115a and 115b, and details thereof are not repeated herein. In some embodiments, the via 251a is electrically connected to the conductive line 265a, the via 251b is electrically connected to the conductive line 265a, and the via 251c is electrically connected to the conductive line 265c.

Figure 19:
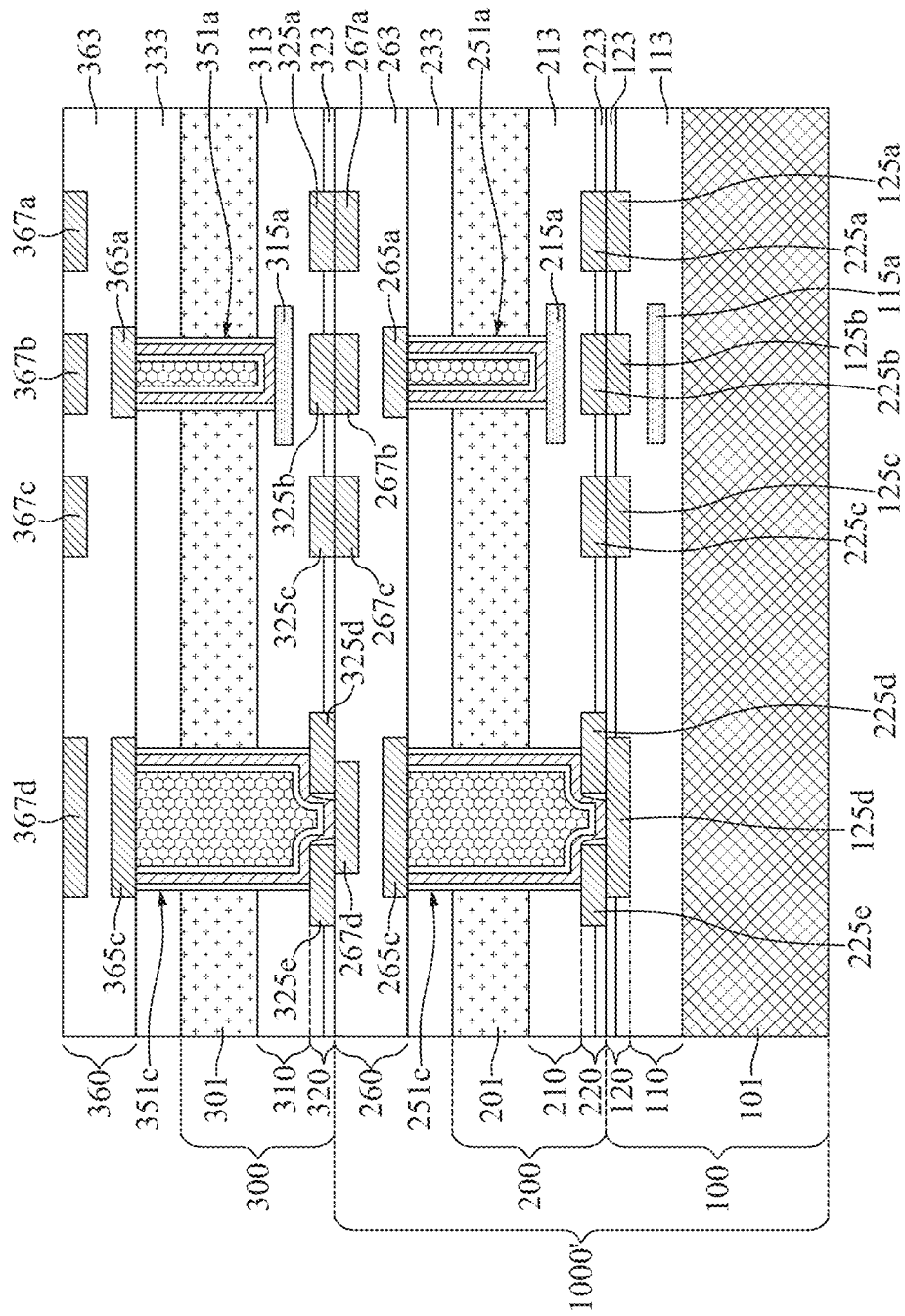
FIGS. 19-21 are cross-sectional views illustrating intermediate stages of forming a semiconductor package structure, in accordance with some embodiments.
Figure 20:
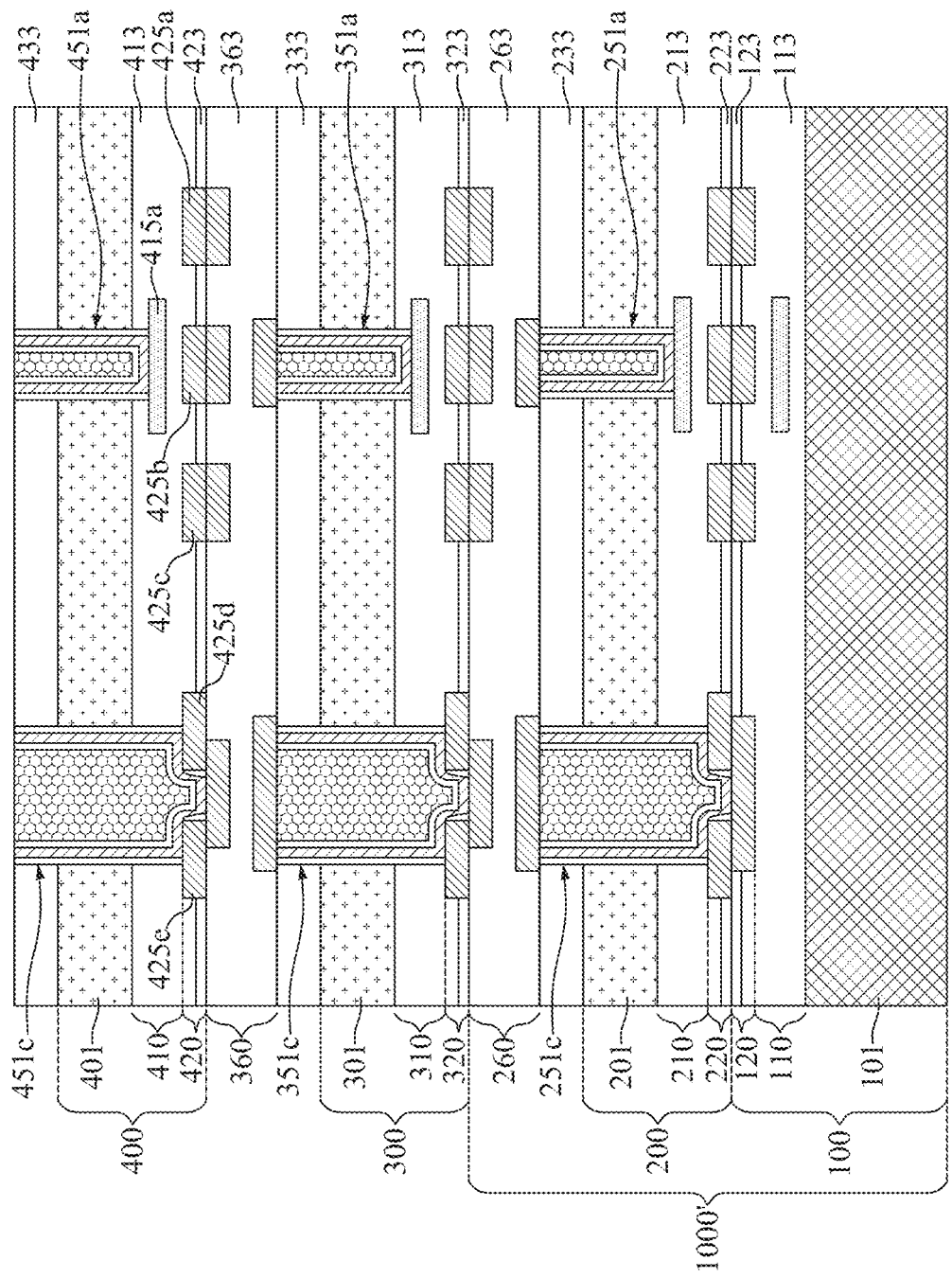
Figure 21:
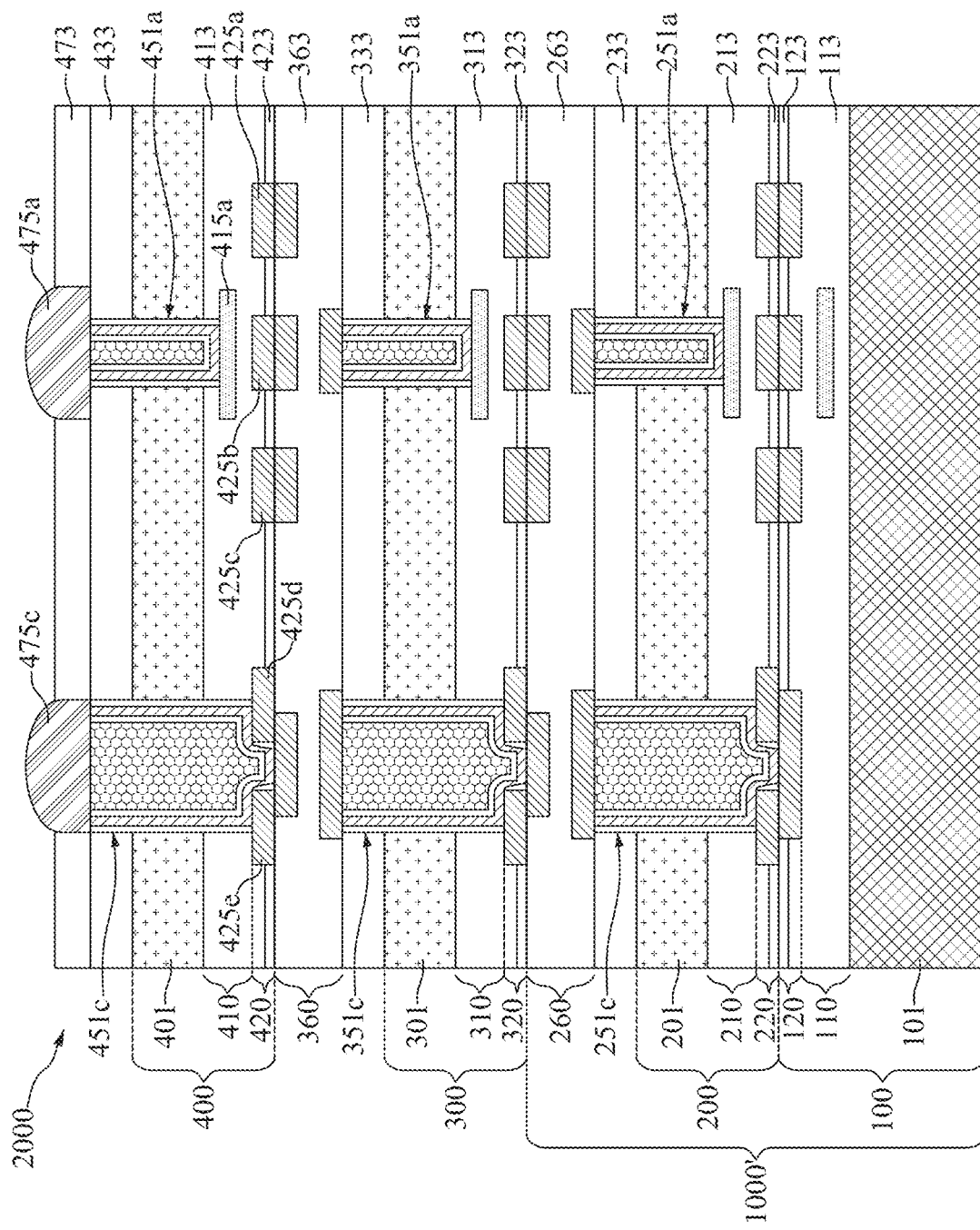

FIGS. 19-21 are cross-sectional views illustrating intermediate stages of forming a semiconductor package structure 2000, in accordance with some embodiments. For clarification, a simplified structure of semiconductor package structure 1000 (i.e., a semiconductor package structure 1000') is illustrated in FIG. 19. As shown in FIG. 19, a third semiconductor wafer 300 is bonded onto the semiconductor package structure 1000', in accordance with some embodiments. Note that the conductive lines 115b and 215b and the via 251b are omitted, and the conductive lines 115a and 115b and the via 251a are laterally shifted to the left for clarification. The processes and materials used to form embodiments such as illustrated in FIGS. 19-21 that are similar to those for the previously describe embodiments will not be repeated.

In some embodiments, the third semiconductor wafer 300 is similar to the second semiconductor wafer 200 where like reference numerals indicate like elements, and the third semiconductor wafer 300 is bonded onto the redistribution structure 260. In some embodiments, the redistribution structure 260 is disposed between the second semiconductor wafer 200 and the third semiconductor wafer 300. In some embodiments, the third semiconductor wafer 300 includes a via 351a, which is similar to the via 251a of the second semiconductor wafer 200, and a via 351c, which is similar to the via 251c of the second semiconductor wafer 200, and the details of the vias 351a and 351c (including the materials and the processes) are not repeated herein.

Moreover, a dielectric layer 333 and a redistribution structure 360, which are similar to the dielectric layer 233 and the redistribution structure 260, are formed over the third semiconductor wafer 300, and the details of the dielectric layer 333 and the redistribution structure 360 are not repeated herein.

Next, a fourth semiconductor wafer 400 is bonded onto the redistribution structure 360, as shown in FIG. 20 in accordance with some embodiments. The fourth semiconductor wafer 400 is similar to the second semiconductor wafer 200 where like reference numerals indicate like elements. In some embodiments, the redistribution structure 360 is disposed between the third semiconductor wafer 300 and the fourth semiconductor wafer 400. In some embodiments, the fourth semiconductor wafer 400 includes a via 451a, which is similar to the via 251a of the second semiconductor wafer 200, and a via 451c, which is similar to the via 251c of the second semiconductor wafer 200, and the details of the vias 451a and 451c (including the materials and the processes) are not repeated herein. Moreover, a dielectric layer 433, which is similar to the dielectric layer 233, is formed over the fourth semiconductor wafer 200, and the details of the dielectric layer 433 are not repeated herein.

Subsequently, a dielectric layer 473 is formed over the dielectric layer 433, and conductive structures 475a and 475c are formed penetrating through the dielectric layer 433, as shown in FIG. 21 in accordance with some embodiments. In some embodiments, the conductive structure 475a is disposed over and electrically connected to the via 451a, and the conductive structure 475c is disposed over and electrically connected to the via 451c. In some embodiments, the conductive structure 475c is electrically connected to the via 251c through the vias 351c and 451c, and the conductive structure 475a is electrically connected to the via 251a through the vias 351a and 451a.

Some materials and processes used to form the dielectric layer 473 are similar to, or the same as those used to form the dielectric layer 113, and details thereof are not repeated herein. In some embodiments, the conductive structures 475a and 475c are solder balls, ball grid array (BGA) balls, controlled collapse chip connection (C4) bumps, microbumps, or pillars. In some embodiments, the conductive structures 475a and 475c are made of a conductive material, such as solder, copper (Cu), nickel (Ni), gold (Au), a combination thereof, or another applicable material. The conductive structures 475a and 475c may be formed by a patterning process, a deposition process, and a planarization process.

After the conductive structures 475a and 475c are formed, the semiconductor package structure 2000 is obtained. Although FIG. 21 shows a semiconductor package structure including four stacked semiconductor wafers, this is only one example. In some embodiments, the semiconductor package structure can include two, three or more than four semiconductor wafers stacked together.

Embodiments of a semiconductor package structure and method for preparing the same are provided in the disclosure. In some embodiments, the semiconductor package structure 1000 includes the first semiconductor wafer 100 and the second semiconductor wafer 200 bonded to the first semiconductor wafer 100. The first semiconductor wafer 100 includes the first bonding pad 125d, and the second semiconductor wafer 200 includes the second bonding pad 225d and the third bonding pad 225e. In some embodiments, the second bonding pad 225d and the third bonding pad 225e are bonded to the first bonding pad 125d, and the via 251c is formed penetrating through the second semiconductor wafer 200 and extending between the second bonding pad 225d and the third bonding pad 225e to physically contact the first bonding pad 125d. By forming at least two bonding pads (e.g., the bonding pads 225d and 225e) in the second semiconductor wafer 200 to bond with the same bonding pad (e.g., the bonding pad 125d) in the first semiconductor wafer 100, bonding pad dishing effect during the planarization process performed on the above-mentioned bonding pads may be reduced. Moreover, since the contact areas between the bonding pads and the via 251c are increased, the performance of the semiconductor package structure 1000 can be enhanced by providing a reduced contact resistance. Furthermore, in the present embodiments, although vias with different sizes (e.g., different widths and/or heights) are formed in the second semiconductor wafer 200, these vias can be formed in the same process steps.

In one embodiment of the present disclosure, a semiconductor package structure is provided. The semiconductor package structure includes a first semiconductor wafer including a first bonding pad. The semiconductor package structure also includes a second semiconductor wafer including a second bonding pad and a third bonding pad. The second bonding pad and the third bonding pad are bonded to the first bonding pad of the first semiconductor wafer. The semiconductor package structure further includes a first via penetrating through the second semiconductor wafer to physically contact the first bonding pad of the first semiconductor wafer. A portion of the first via is disposed between the second bonding pad and the third bonding pad.

In another embodiment of the present disclosure, a semiconductor package structure is provided. The semiconductor package structure includes a first semiconductor wafer including a first bonding pad. The semiconductor package structure also includes a second semiconductor wafer including a second bonding pad and a third bonding pad exposed at a first side of the second semiconductor wafer. The second bonding pad and the third bonding pad are bonded to the first bonding pad of the first semiconductor wafer. The semiconductor package structure further includes a first via extending from the first side of the second semiconductor wafer to a second side of the second semiconductor wafer. The first via is in direct contact with the first bonding pad, the second bonding pad and the third bonding pad. In addition, the semiconductor package structure includes a first conductive line disposed in the second semiconductor wafer and away from the first side of the second semiconductor wafer, and a second via disposed in the second semiconductor wafer and extending from the second side of the second semiconductor wafer to the first conductive line. A width of the first via is greater than a width of the second via.

In yet another embodiment of the present disclosure, a method for preparing a semiconductor package structure is provided. The method includes forming a first semiconductor wafer including a first bonding pad, and forming a second semiconductor wafer including a second bonding pad and a third bonding pad. The method also includes bonding the second semiconductor wafer onto the first semiconductor wafer using a hybrid bonding process such that the second bonding pad and the third bonding pad are bonded to the first bonding pad, and forming a first opening and a second opening in the second semiconductor wafer by performing a first etching process. The first bonding pad is exposed by the first opening, and a first conductive line in the second semiconductor wafer away from an interface between the first semiconductor wafer and the second semiconductor wafer is exposed by the second opening. The method further includes forming a first via in the first opening and a second via in the second opening.

The embodiments of the present disclosure have some advantageous features. By forming at least two bonding pads in the second semiconductor wafer to bond with the same bonding pad in the first semiconductor wafer, bonding pad dishing effect during the planarization process performed on the bonding pads may be reduced, and the performance of the semiconductor package structure can be enhanced by providing a reduced contact resistance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor package structure, comprising:
a first semiconductor wafer including a first bonding pad;

a second semiconductor wafer including a second bonding pad and a third bonding pad, wherein the second bonding pad and the third bonding pad are bonded to the first bonding pad of the first semiconductor wafer; and a first via penetrating through the second semiconductor wafer to physically contact the first bonding pad of the first semiconductor wafer, wherein a portion of the first via is disposed between the second bonding pad and the third bonding pad.

2. The semiconductor package structure of claim 1, wherein the first via is in direct contact with a sidewall of the second bonding pad and a sidewall of the third bonding pad facing the sidewall of the second bonding pad.

3. The semiconductor package structure of claim 1, wherein the first via is in direct contact with a top surface of the second bonding pad and a top surface of the third bonding pad.

4. The semiconductor package structure of claim 1, wherein the second bonding pad and the third bonding pad are different portions of a single continuous ring structure.

5. The semiconductor package structure of claim 1, wherein the first semiconductor wafer further includes a fourth bonding pad and the second semiconductor wafer further includes a fifth bonding pad bonded to the fourth bonding pad, and wherein a width of the fourth bonding pad is less than a width of the first bonding pad.

6. The semiconductor package structure of claim 1, further comprising:
a second via disposed in the second semiconductor wafer, wherein a width of the second via is less than a width of the first via.

7. The semiconductor package structure of claim 6, wherein a top surface of the second via is coplanar with a top surface of the first via, and a bottom surface of the second via is higher than a bottom surface of the first via.

8. A semiconductor package structure, comprising:
a first semiconductor wafer including a first bonding pad;
a second semiconductor wafer including a second bonding pad and a third bonding pad exposed at a first side of the second semiconductor wafer, wherein the second bonding pad and the third bonding pad are bonded to the first bonding pad of the first semiconductor wafer;
a first via extending from the first side of the second semiconductor wafer to a second side of the second semiconductor wafer, wherein the first via is in direct contact with the first bonding pad, the second bonding pad and the third bonding pad;
a first conductive line disposed in the second semiconductor wafer and away from the first side of the second semiconductor wafer; and
a second via disposed in the second semiconductor wafer and extending from the second side of the second semiconductor wafer to the first conductive line, wherein a width of the first via is greater than a width of the second via.

9. The semiconductor package structure of claim 8, wherein the first semiconductor wafer further includes a fourth bonding pad and the second semiconductor wafer further includes a fifth bonding pad bonded to the fourth bonding pad, and wherein a width of the first bonding pad is greater than a width of the fourth bonding pad.

10. The semiconductor package structure of claim 8, wherein the first via is in direct contact with a top surface of the first bonding pad, a top surface and a sidewall of the second bonding pad, and a top surface and a sidewall of the third bonding pad facing the sidewall of the second bonding pad.

11. The semiconductor package structure of claim 8, wherein the first via further comprises:
an upper liner disposed over a top surface of the second bonding pad and a top surface of the third bonding pad; and
a lower liner covering a sidewall of the second bonding pad and a sidewall of the third bonding pad facing the sidewall of the second bonding pad, wherein the lower liner is separated from the upper liner.

12. The semiconductor package structure of claim 11, wherein the first via further comprises:
a barrier layer surrounding a conductive layer, wherein the barrier layer is surrounded by the upper liner and the lower liner, and wherein the barrier layer is in direct contact with a top surface of the first bonding pad, the top surface of the second bonding pad, and the top surface of the third bonding pad.

13. The semiconductor package structure of claim 8, further comprising:
a redistribution structure disposed on the second side of the second semiconductor wafer;
a third semiconductor wafer including a sixth bonding pad and a seventh bonding pad exposed at a first side of the third semiconductor wafer, wherein the sixth bonding pad and the seventh bonding pad are bonded to a second conductive line in the redistribution structure; and
a third via extending from the first side of the third semiconductor wafer to a second side of the third semiconductor wafer, wherein the third via is in direct contact with the sixth bonding pad, the seventh bonding pad and the second conductive line.

14. The semiconductor package structure of claim 13, further comprising:
a third conductive line disposed in the third semiconductor wafer and away from the first side of the third semiconductor wafer; and
a fourth via disposed in the third semiconductor wafer and extending from the second side of the third semiconductor wafer to the third conductive line, wherein a width of the third via is greater than a width of the fourth via.

15. A method for preparing a semiconductor package structure, comprising:
forming a first semiconductor wafer including a first bonding pad;
forming a second semiconductor wafer including a second bonding pad and a third bonding pad;
bonding the second semiconductor wafer onto the first semiconductor wafer using a hybrid bonding process such that the second bonding pad and the third bonding pad are bonded to the first bonding pad;
forming a first opening and a second opening in the second semiconductor wafer by performing a first etching process, wherein the first bonding pad is exposed by the first opening, and wherein a first conductive line in the second semiconductor wafer away from an interface between the first semiconductor wafer and the second semiconductor wafer is exposed by the second opening; and
forming a first via in the first opening and a second via in the second opening.

16. The method for preparing a semiconductor package structure of claim 15, wherein a width of the first opening is greater than a width of the second opening.

17. The method for preparing a semiconductor package structure of claim 15, further comprising:

thinning the second semiconductor wafer after the second semiconductor wafer is bonded onto the first semiconductor wafer and before the first etching process is performed.

18. The method for preparing a semiconductor package structure of claim 15, wherein the first opening has a lower portion and an upper portion, the lower portion of the first opening is between the second bonding pad and the third bonding pad, and the upper portion of the first opening exposes a top surface of the second bonding pad and a top surface of the third bonding pad.

19. The method for preparing a semiconductor package structure of claim 15, further comprising:

forming a redistribution structure on a side of the second semiconductor wafer opposite from the first semiconductor wafer, wherein the redistribution structure has a second conductive line and a third conductive line exposed at opposite sides of the redistribution structure, and the second conductive line is in direct contact with the first via;

forming a third semiconductor wafer including a fourth bonding pad and a fifth bonding pad; and bonding the third semiconductor wafer onto the redistribution structure such that the fourth bonding pad and the fifth bonding pad are bonded to the third conductive line.

20. The method for preparing a semiconductor package structure of claim 19, further comprising:

forming a third opening and a fourth opening in the third semiconductor wafer by performing a second etching process, wherein the third conductive line, the fourth bonding pad and the fifth bonding pad are exposed by the third opening, and a fourth conductive line in the third semiconductor wafer away from an interface between the third semiconductor wafer and the redistribution structure is exposed by the fourth opening, and wherein a width of the third opening is greater than a width of the fourth opening; and forming a third via in the third opening and a fourth via in the fourth opening.

\* \* \* \* \*